United States Patent [19]

Held

[11] Patent Number: 4,654,296

[45] Date of Patent: Mar. 31, 1987

[54] PROCESS FOR MAKING LITHOGRAPHIC FILM USING PHOTOPOLYMER DIFFUSION MODULATION LAYER FOR PIGMENTED BOTTOM LAYER

[75] Inventor: Robert P. Held, Englishtown, N.J.

[73] Assignee: E. I. Du Pont de Nemours and Company, Wilmington, Del.

[21] Appl. No.: 850,817

[22] Filed: Apr. 11, 1986

Related U.S. Application Data

[62] Division of Ser. No. 634,183, Jul. 27, 1984, abandoned.

[51] Int. Cl.$^4$ .................................................. G03C 5/00
[52] U.S. Cl. ................................... 430/325; 430/271; 430/281; 430/326
[58] Field of Search ................ 430/271, 281, 325, 326

[56] References Cited

U.S. PATENT DOCUMENTS

| | | | |
|---|---|---|---|
| 3,718,473 | 2/1973 | Gervay et al. | 96/83 |
| 4,029,509 | 6/1977 | Blake | 96/60 R |
| 4,047,956 | 9/1977 | Blake | 96/60 R |

Primary Examiner—Jack P. Brammer

[57] ABSTRACT

Photopolymerizable element for preparation of lithographic film comprising (1) support (2) hydrophilic resin layer containing dispersed metal particles, e.g., silver, and (3) photopolymerizable layer comprising a hydrophilic macromolecular organic polymeric dispersion, e.g., gelatin medium, including a dispersed phase of ethylenically unsaturated monomer and photoinitiator or photoinitiator system. The element can form a negative lithographic film after imagewise exposure by bleaching, rinsing, optionally fixing and drying. A positive lithographic film is prepared after imagewise exposure by immersing in bath containing compound which generates sulfide ions and treating with bleach solution followed by rinsing and drying.

21 Claims, No Drawings

PROCESS FOR MAKING LITHOGRAPHIC FILM USING PHOTOPOLYMER DIFFUSION MODULATION LAYER FOR PIGMENTED BOTTOM LAYER

This is a division of application Ser. No. 634,183, filed 7/27/84, now abandoned.

DESCRIPTION

1. Technical Field

This invention relates to a photopolymerizable element for the preparation of lithographic film. This invention more preferably relates to a multilayer photopolymerizable element having a hydrophilic resin layer having dispersed therein metal particles and a photopolymerizable layer having a dispersed phase of monomer and initiator. This invention also relates to a process for the preparation of negative lithographic film and a process for the preparation of positive lithographic film.

2. Background Art

In the photomechanical trades, a mask containing an image that is opaque to actinic radiation is used in preparing a printing plate of some kind, e.g., letterpress, lithographic, etc. The mask is used as a phototool in exposing a layer of photosensitive resist-forming material present on a metal or plastic plate or a photopolymer printing plate matrix. After the exposure the printing plate is formed by etching or liquid development depending on the system present. The image in the mask must be of the highest possible contrast, e.g., completely opaque black in the image areas, and completely transparent (free from fog) in the unexposed areas. Silver halide film known as "litho" film is used to prepare the mask. When a litho film is exposed through a halftone screen and developed, it contains an image comprised of dots. The dots correspond to the areas of the film under the transparent areas of the halftone screen and are comprised of exposed and developed material. In silver halide litho film, these dots may be reduced in size by a process referred to as "dot etching", i.e., reducing the size of, or "etching" the halftone dots, thereby changing the tone values of the image. In silver halide films dot etching is accomplished chemically by treating the films with a silver "solvent". Silver halide films are expensive and require special red light handling.

Photopolymerizable elements are becoming more advantageous in the preparation of lithographic films which are capable of dot-etching. One such element is described in Bratt and Cohen U.S. Pat. No. 4,173,673 wherein a single photopolymer layer is present having an optical density in the actinic region of at least 3.0 and having a thickness no greater than 0.015 mm. The dot-etching of such a photopolymerizable element requires the proper balance of the imagewise exposure and the undercutting of the formed polymeric dots with a solvent and mechanical action on the image bearing surface of the element.

It is therefore desirable to provide an element having two layers, the upper layer being photopolymerizable which contains a dispersed phase which permits diffusion control to form an image, and the lower layer being capable of being dot etched by a method similar to current silver techniques. The element is capable of forming either a negative or positive lithographic film.

DISCLOSURE OF THE INVENTION

In accordance with this invention, there is provided a photopolymerizable element for the preparation of lithographic film comprising, in order (1) a support, (2) a hydrophilic resin layer having dispersed therein fine metal particles, and (3) a photopolymerizable layer comprising a hydrophilic macromolecular organic polymer dispersion medium, including a dispersed phase containing (a) at least one ethylenically unsaturated monomer having a boiling point above 100° C. at normal atmospheric pressure and being capable of forming a high polymer by free-radical initiated, chain-propagating addition polymerization; and (b) in reactive association with the monomer (a), at least one free radical photoinitiator or photoinitiator system activatable by actinic radiation in an amount constituting from 0.01 to 20.0 percent by weight of the total solids in the dispersion.

In accordance with this invention, there is also provided a process for preparing a negative lithographic film which comprises:

(a) exposing imagewise a photopolymerizable element comprising, in order, (1) a support, (2) a hydrophilic resin layer having dispersed therein fine metal particles, and (3) a photopolymerizable layer comprising a hydrophilic macromolecular organic polymer dispersion medium, including a dispersed phase containing (a) at least one ethylenically unsaturated monomer having a boiling point above 100° C. at normal atmospheric pressure and being capable of forming a high polymer by free-radical initiated, chain-propagating addition polymerization; and (b) in reactive association with the monomer, at least one free radical photoinitiator or photoinitiator system activatable by actinic radiation in an amount constituting from 0.01 to 20.0 percent by weight of the total solids in the dispersion:

(b) treating the photopolymerized element with a bleach solution which diffuses through the unexposed areas and dissolves the metal particles;

(c) rinsing the treated element to remove excess bleach;

(d) optionally fixing the rinsed element; and (e) drying the element.

In accordance with this invention, there is furthermore provided a process for preparing a positive lithographic film which comprises (a) exposing imagewise a photopolymerizable element comprising, in order, (1) a support, (2) a hydrophilic resin layer having dispersed therein fine metal particles, and (3) a photopolymerizable layer comprising a hydrophilic macromolecular organic polymer dispersion medium, including a dispersed phase containing (a) at least one ethylenically unsaturated monomer having a boiling point above 100° C. at normal atmospheric pressure and being capable of forming a high polymer by free-radical initiated, chain-propagating addition polymerization; and (b) in reactive association with the monomer, at least one free radical photoinitiator or photoinitiator system activatable by actinic radiation in an amount constituting from 0.01 to 20.0 percent by weight of the total solids in the dispersion;

(b) immersing the exposed element in a bath containing a compound capable of generating sulfide ions which diffuse imagewise through the exposed diffusion resist;

(c) treating the photopolymerized element with a bleach solution which is resisted by the metal sulfide formed in the unexposed areas;

(d) rinsing the element to remove excess bleach; and (e) drying the element.

The photopolymerizable element comprises (1) a support, (2) a lower hydrophilic resin layer having dispersed therein fine metal particles, and (3) a layer of a photopolymerizable dispersion which comprises a hydrophilic, organic, macromolecular polymer dispersion medium including a dispersed phase containing:

(a) at least one ethylenically unsaturated monomer having a boiling point above 100° C. at normal atmospheric pressure, being capable of forming a high polymer by free-radical initiated, chain-propagating addition polymerization, and (b) in reactive association with (a) a free radical photoinitiator activatable by actinic radiation in an amount of from 0.01 to 20.0 percent by weight of the total solids in the composition.

The support (1) on which layers (2) and (3) are present are films composed of high polymers which are cast as film from molten polymer, e.g., polyamides such as polyhexamethylene sebacamide, polyhexamethylene adipamide; polyolefins, e.g., polypropylene; polyesters, e.g., polyethylene terephthalate, polyethylene terephthalate/isophthalate; vinyl polymers, e.g., vinyl acetals, vinylidene chloride/vinyl chloride copolymers, polystyrene, polyacrylonitrile; cellulosics, e.g., cellulose acetate, cellulose acetate/butyrate, cellophane, etc. A particularly preferred support material is polyethylene terephthalate film described in Alles et al U.S. Pat. No. 2,627,088 and Alles U.S. Pat. No. 2,779,684, with or without the surface coating described in the former patent, and Rawlins U.S. Pat. No. 3,433,950. The support may have a resin "sub" or other layer thereon which is considered part of the support. Preferred sub layers have a thickness not exceeding about 0.0002 inch (0.005 mm). The support is generally 0.001 inch to 0.005 inch (0.025 to 0.19 mm) in thickness. Where the particular application does not require that the base support be transparent, the support may be opaque, e.g., paper, especially water-proof photographic paper; thin metal sheets especially aluminum and copper sheets cardboard, etc.

The hydrophilic resin layer (2) with a dispersion of fine metal particles is prepared as described in the examples below and is coated, e.g., with a doctor knife or other suitable means known to the art, onto the support. It is also possible to laminate the support to the resin layer. The fine metal particles dispersed in the hydrophilic resin, are generally in a size range of 0.001 to 10 micrometers or more. Useful metal particles include: silver, copper, nickel, iron, cobalt, aluminum, gold, chromium, zinc, tin, lead, silicon, etc. and mixtures thereof or alloy particles. Preferably the metals are present as colloidal dispersions. Magnetic materials, e.g., Fe-Co, Fe-Ni, etc. are also useful. The amount of metal particles dispersed in the hydrophilic resin layer is 5 to 55% by weight based on the weight of the layer, preferably about 8 to 25% by weight. In most practical elements the transmission optical density to visible light of the metal-containing layer will be at least 0.5 and, preferably, at least 1.0. In preferred elements it will be at least 2.0.

The hydrophilic resin not only retains the fine metal particles dispersed therein but also helps the penetration and diffusion of a developing solution for reaching and dissolving the metal particles. Hydrophilic polymers known in the art are useful, e.g., gelatin, casein, polyvinyl alcohol, partially esterified polyvinyl alcohols containing unsubstituted vinyl alcohol units, cellulose derivatives, etc. The thickness of the hydrophilic resin layer is about 0.0002 to about 0.0015 inch (0.005 to 0.038 mm), preferably 0.0007 to 0.0008 inch (0.018 to 0.020 mm).

The layer of photopolymerizable dispersion is described in Gervay and Walker U.S. Pat. No. 3,718,473. The binder in the dispersing medium is preferably gelatin but other natural or synthetic water-permeable organic colloid binding agents can be used, e.g., water-permeable or water-soluble polyvinyl alcohol and its derivatives, e.g., partially hydrolyzed polyvinyl acetates, polyvinyl ethers, and acetals containing a large number of extralinear —$CH_2CHOH$ groups; hydrolyzed interpolymers of vinyl acetate and unsaturated addition polymerizable compounds such as maleic anhydride, acrylic and methacrylic acid ethyl esters and styrenes. Suitable colloids of the last mentioned type are disclosed in U.S. Pat. Nos. 2,276,322; 2,276,323; and 2,397,866. The useful polyvinyl acetals include polyvinyl acetaldehyde acetal, polyvinyl butyraldehyde acetal and polyvinyl sodium o-sulfobenzaldehyde acetal. Other useful colloid binding agents include the poly-N-vinyl-lactams of Bolton, U.S. Pat. No. 2,495,918, and hydrophilic copolymers of N-acrylamido alkyl betaines described in Shacklett, U.S. Pat. No. 2,833,650 and hydrophilic cellulose ethers and esters. A binder may be added to the dispersed phase, e.g., to act as viscosity modifiers. The viscosity of the droplets may be increased to a point near a "threshold" value whereby an additional increase in viscosity through polymerization may effect a very noticeable change in same physical or chemical property. Useful binders include: water-insoluble polymers, e.g., methyl methacrylate resins, polyvinyl acetals such as polyvinyl butyral and polyvinyl formal, vinylidene chloride copolymers (e.g., vinylidene chloride/acrylonitrile, vinylidene chloride/methacrylate and vinylidene chloride/vinyl-acetate copolymer, synthetic rubbers (e.g., butadiene/acrylonitrile copolymers, and chloro-2-butadiene-1, 3-polymers), cellulose esters (e.g., cellulose acetate, cellulose acetate succinate and cellulose acetate butyrate), polyvinyl esters (e.g., polyvinyl acetate/acrylate, polyvinyl acetate/methacrylate and polyvinyl acetate/polyvinyl chloride) and copolymers (e.g., polyvinyl chloride acetate), polyurethanes, polystyrene, and polymeric binders disclosed in Schoenthaler U.S. Pat. No. 3,418,295, etc. From 1 to 10 percent or more by weight of total solids, of a nonpolymerizable plasticizer may be present in the organic phase of the photopolymerizable dispersion to improve the photographic speed. A preferred plasticizer is the mixed ester of triethylene glycol dicaprylate and dicaprate.

Suitable free-radical initiated, chain-propagating addition polymerizable ethylenically unsaturated compounds include preferably an alkylene or a polyalkylene glycol diacrylate prepared from an alkylene glycol of 2 to 15 carbons or a polyalkylene ether glycol of 1 to 10 ether linkages, and those disclosed in Martin and Barney U.S. Pat. No. 2,927,022, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester structures. The following specific compounds are further illustrative of this class; unsaturated esters of alcohols, preferably the unsaturated esters of polyols and particularly such esters of the alpha-methylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,5-pentanediol dimethacrylate, the bis-acrylates and methacrylates of polyethylene glycols of molecular weight 200-500, trimethylol propane triacrylate, etc.; vinyl esters such as divinyl succinate, divinyl adipate, divinyl phthalate and divinyl terephthalate; styrene and derivatives thereof and unsaturated aldehydes, such as sorbaldehyde (hexadienal). An outstanding class of these preferred addition polymerizable components are the esters of alpha-methylene carboxylic acids and substituted carboxylic acids with polyols and polyamides wherein the molecular chain between the hydroxyls and amino groups is solely carbon or oxygen interrupted carbon. The preferred monomeric compounds are difunctional, but monofunctional monomers can also be used. In addition, the polymerizable, ethylenically unsaturated polymers of Burg, U.S. Pat. No. 3,043,805, Martin, U.S. Pat. No. 2,929,710 and similar materials may be used alone or mixed with other materials.

In addition to the initiating systems described above the materials capable of absorbing actinic radiation may be a cyanine, carbocyanine, or merocyanine dye. The various cyanine and related dyes have been well known in photography for many years and include such dyes as 3-ethyl-5-(2-ethyl-1-benzoxyalidene-β-methyl ethylidene)-2-thio-2,4(3,5)oxazoledione (prepared as described in Example 16 of Kendall, U.S. Pat. No. 2,272,163. Suitable photoreducible dyes are disclosed in U.S. Pat. Nos. 2,850,445 and 2,875,047. Also useful are combinations of one or more of the above dyes with quinone type compounds, e.g., phenanthrenequinone in combination with the dye prepared according to Example 16 of Kendall, U.S. Pat. No. 2,272,163. Other useful materials for absorbing actinic radiation are the free-radical generating addition polymerization initiators activatable by actinic light and thermally inactive at or below 185° C. These include the substituted or unsubstituted polynuclear quinones which are compounds having two intracyclic carbonyl groups attached to intracyclic carbon atoms in a conjugated carbocyclic ring system. Suitable such initiators include: 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2-3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in Plambeck U.S. Pat. No. 2,760,863 and include vicinal ketaldonyl compounds, such as diacetyl, benzil, etc., α-ketaldonyl alcohols, such as benzoin, pivaloin, etc., acyloin ethers, e.g., benzoin methyl and ethyl ethers, etc., α-hydrocarbon substituted aromatic acyloins, including o-methylbenzoin, α-allylbenzoin, and o-phenylbenzoin.

Another suitable initiator system that can be used in the photopolymerizable dispersions and elements of this invention is the lophine dimers (2,4,5-triphenylimidazolyl dimers), consisting of two lophine radicals bound together by a single covalent bond, e.g., 2-(o-chlorophenyl)-4,5-diphenylimidazolyl dimer and others, described in British Patent specification Nos. 997,396, published July 7, 1965, and 1,047,569, published Nov. 9, 1966. Suitable free radical producing hydrogen donor agents for use in such systems, e.g., organic amines, mercaptans triphenylmethane dyes, are set forth in the above-stated British Specification. Suitable color amine-substituted leuco dyes which function both as a color forming agent and a free radical generating agent can be used in the dispersions of this invention. Especially useful leuco dyes have at least one dialkylamino group. Also, any amine substituted leuco triphenylmethane dye or various salts of the dye can be used. Leuco forms of crystal violet which are oxidized upon exposure to form visible images are preferred. Other suitable leuco dyes or their salts are disclosed in Chang et al., U.S. Pat. No. 3,549,367.

Thermal polymerization inhibitors can be present in the layer of photopolymerizable dispersion to prevent premature thermal polymerization. Suitable inhibitors include: p-methoxyphenol, hydroquinone, and alkyl and aryl-substituted hydroquinones and quinones, t-butyl catechol, pyrogallol, copper resinate, naphthylamines, beta-naphthol, cuprous chloride, 2-6-di-t-butyl-p-cresol, phenothiazine, pyridine, nitrobenzene and dinitrobenzene. Other useful inhibitors include p-toluquinone and chloranil and thiazine dyes, e.g., Thionine Blue G (C.I. Basic Blue 25), Methylene Blue B (C.I. Basic Blue 9) and Toluidine Blue O (C.I. Basic Blue 17). In embodimnts containing certain dyes or quinone-type photoinitiators no thermal inhibitor may be necessary since these initiators also serve, in the dark, as thermal inhibitors.

Although not essential, it is preferred that a surfactant be employed in dispersing the droplets. Such surfactants are alkylnaphthalene sulfonic acid salts, organic esters of phosphoric acid, benzyl alcohol, octyl alcohol, lauryl alcohol, sodium lauryl sulphate, sulphonated derivatives of fatty acid amides, the condensation products of octyl phenol and sorbitan monolaurate with polyethylene oxide, etc.

In a preferred embodiment of the photopolymerizable element there can be added to the hydrophilic resin layer (2) 5 to 40 percent by weight, preferably 16 to 19 percent by weight, of a dispersion of (a) ethylenically unsaturated monomer having a boiling point above 100° C. at normal atmospheric pressure, and (b) free radical photoinitiator or photoinitiator system. The weight percentages are based on the total weight of the layer. The monomer and photoinitiator can be of the types described above. Preferably the monomer and photoinitiator or photoinitiator system present in the hydrophilic resin layer are the same as the monomer and photoinitiator or photoinitiator system present in the photopolymerizable layer.

The invention also relates to processes for preparing both negative and positive lithographic films. The above-described photopolymerizable element is exposed imagewise through a phototool, e.g., image bearing transparency, photomask etc. to a source of actinic radiation generally exhibiting its maximum sensitivity in the ultraviolet range. Such radiation sources include: carbon arcs, mercury-vapor arcs, pulsed xenon arcs, fluorescent lamps with ultraviolet radiation-emitting phosphors, argon glow lamps, electronic flash units, photographic flood lamps, etc. The exposure generally ranges from 2 seconds to 6 minutes but is dependent on the particular photopolymerizable element, radiation source and distance of the source to the element.

The imagewise exposed photopolymerizable element, e.g., exposed to form halftone dots, can be processed by treating, e.g., dipping the element in an etching solution, e.g., 42° Baumé ferric chloride, for 5 to 180 seconds, followed by a water rinse. Other metal etchants or bleaches specific for the metals used, can also be employed. When using blue, colloidal silver as the fine particulate metal in the hydrophilic resin layer, a negative image of the original image is obtained by the etching of the colloidal silver layer in the areas corresponding to the unexposed photopolymerizable portions.

In another method for forming a negative image of the original, after imagewise exposure the exposed element is developed at room or elevated temperature for 5 seconds to 6 minutes, preferably 1 minute in a bleach solution, e.g., ferricyanide bleach as described in Example 2 below, strong inorganic acids, cupric nitrate, dichromates, etc. The bleached element is then rinsed with water for a maximum of about 15 seconds, and optionally can be treated in conventional silver halide fixer solution, e.g., aqueous sodium thiosulfate solution, if the metal is silver. The fixing treatment removes any haze that may be present in the background areas and is conducted at 20° to 30° C. for a period of to 5 to 30 seconds, preferably at 25° C. for 10 seconds. Finally the rinsed and fixed element is dried, e.g., at room temperature or elevated temperature which has no effect on the processed element.

In preparing positive lithographic film, after imagewise exposure, the exposed element is treated, e.g., by immersing, in a bath containing a compound capable of generating sulfide ions. The sulfide ions formed diffuse through the areas of the element corresponding to the unexposed photopolymerizable portions. Suitable solutions for generating the sulfide ions are: hydroquinone/metol mixed developer containing (per liter) 0.2 g/liter of thiourea and 1 ml of a 1 percent solution of phenylmercaptotetrazole (1/g/100 ml in alcohol). Other compounds capable of generating sulfide ions include: substituted thioureas, mono- or di-N-substituted thioacetamides, dialkyl substituted dithiocarbamates, etc. The element is then bleached, e.g., in a bleach solution as described above, rinsed in water for a maximum of 15 seconds, optionally fixed in a fixer as described above and again rinsed in water. A direct positive image is formed because the free sulfide ions which diffuse imagewise through the exposed diffusion resist form silver halide in the unexposed areas which are resistant to the bleach solution.

An alternative method of forming a direct positive image as described in Example 5 below involves the presence of a photoinhibitor in the organic phase of the photopolymerizable layer. Suitable precursors which form photoinhibitors are disclosed in Pazos U.S. Pat. No. 4,198,242, the disclosure of which is incorporated by reference. A preferred precursor compound is α-methyl-1-(2'-nitro-4',5'-dimethoxy)phenyl-1-(4-t-butylphenoxy)ethane (α-MeBPE). 6-nitrovertraldehyde can also be used as a precursor compound. After imagewise exposure through a positive image, the positive image is removed from the surface of the element and the element is exposed overall for 2 to 6 minutes through a filter which filters out radiation above 400 nm, e.g., Cyasorb ® UV24 Filter. The monomer polymerizes in the areas where no inhibitor is generated, e.g., unexposed areas. The exposed element is then developed by bleaching in one of the bleaching solutions as described above. After rinsing in water and drying as previously described a direct positive image is obtained. A preferred embodiment of the invention is described in Example 3.

INDUSTRIAL APPLICABILITY

The two-layer photopolymerizable element is useful for the preparation of lithographic film. The process involves diffusion of etchant through the imaged areas. Either a negative or positive working lithographic film can be prepared depending on the specific steps that are used in the process. High quality halftone dots are obtained which are capable of being etched in conventional systems. An embodiment of the element includes small amounts of photosensitive monomer and photoinitiator in the lower pigmented layer. The addition of monomer and photoinitiator is found to slow the diffusion of the etchant through the imaged areas and sideways through the nonimaged areas with an improvement in processing latitude and image density. The lithographic film containing the halftone dots is useful in lithographic plate making, wherein a mask of the invention is one of a plurality of color separation masks. The size of the exposed areas (dots) is carried out to an extent whereby a composite color image produced with the masks (on a lithographic plate or on a proofing film) has the same tonal balance as the original color image.

In use, a printer desiring to prepare full color prints of a process transparency would expose the yellow photomask of this invention to a halftone image of the yellow component of the process transparency, the magenta photomask to the magenta component, the cyan photomask to the cyan component, and, usually, a black photomask to the gray-to-black component. After exposure and development, the imaged masks would be assembled, one on top of the other in register, to yield a full color proof of the original, e.g., when viewed with transmitted light. If the color reproduction was satisfactory, each imaged photomask would be used for exposing a positive-working photosensitive printing plate, which when processed and inked with an ink corresponding in color to the color of the photomask, would yield prints of that color. Multiple printing from plates exposed through each of the yellow, magenta, cyan, and black imaged masks, and inked accordingly, would yield a faithfully reproduced full-color print of the original process transparency.

At other times, when the color-coded above described imaged photomasks have been assembled for proofing, it may be observed that the full color proof is, for example, too yellow, or too red, etc., either overall or in certain regions. In this instance, the imaged photomask corresponding to the excess color would be corrected by dot etching, either overall or locally. After dot etching, the imaged photomasks would be reassembled and inspected again. Further corrections may be necessary, and they would be made until the assembled masks gave the full-color reproduction desired. When satisfactory, each mask would then be used to expose a photosensitive printing plate.

EXAMPLES

The following examples illustrate the invention wherein the percentages are by weight.

EXAMPLE 1

This example demonstrates the use of blue, colloidal silver as the fine particulate metal dispersed in a resin layer. The following solutions were prepared:

I. Resin (gelatin) Solution:
a. Disperse 96 g bone gelatin in 1,680 ml of cold water.
b. Stir dispersion for 15 minutes; and then heat to 40° C. until all of the gelatin is dissolved.
c. Hold the heated dispersion for an additional 15 minutes, and then add 7 ml of 3N NaOH and adjust pH to 9.0.

II. Silver Nitrate Solution:
a. Dissolve 14.5 g strontium nitrate in 132 ml cold water.
b. Add 150 ml of 3N silver nitrate and stir at 40° C.

III. Silver Reduction Solution:
330 ml water
62.5 g sodium sulfite (anhydr.)
12.75 g hydroquinone The colloidal silver dispersion in gelatin was made by:
A. Adding Solution II to Solution I with stirring at 40° C., and then holding for 15 minutes.
B. Adding Solution III to the above mixture described in A. over a 60 second period.
C. Digesting at 40° C. for 30 minutes.
D. Analysis:
pH=5.20
solids=11.2%

A photopolymerizable mixture was made from the following ingredients:

| Ingredients | Amt. (g) |
|---|---|
| I. Aqueous Phase: | |
| Gelatin | 18.0 |
| Polyvinylpyrrolidone (40% in water) | 0.6 |
| Dispersing agent, a phosphate ester in acid form (Triton ® QS-44) | 0.5 |
| Water | 230 |
| II. Organic Phase: | |
| Trimethylol propane triacrylate (TMPTA) | 12.0 |
| Triethylene glycol dicaprate triethylene glycol dicaprylate (Plasticizer SC ®) | 3.0 |
| 2-(o-chlorophenyl)-4,5-diphenylimidazolyl dimer (o-Cl-HABI) | 3.0 |
| (Tris-(4-diethylamino-o-tolyl) methane), TLA-454 | 1.5 |
| Leuco Crystal Violet, Basic Violet 3 C.I. No. 42553 | 0.3 |
| Methylene chloride | 25.0 |

These two phases were then thoroughly mixed in a Waring Blender for about 15 minutes.

The colloidal silver dispersion in gelatin was then coated with a 0.006 inch (0.152 mm) doctor knife on a biaxially oriented and heat set polyethylene terephthalate film support which had first been coated with a resin sub made from a vinylidene chloride/alkyl acrylate/itaconic acid copolymer mixed with an alkyl acrylate and/or methacrylic polymer as described by Rawlins in U.S. Pat. No. 3,433,950 over which had been coated a thin anchoring substratum of gelatin (about 0.5 mg/dm$^2$). The colloidal silver layer was then dried and found to contain about 0.7 g/m$^2$ of silver.

The photopolymerizable mixture was then coated over this colloidal silver layer using a 0.004 inch (0.10 mm) doctor knife and dried.

A sample of these coatings, containing a structure which appears as:
(1) the support;
(2) the hydrophilic resin layer containing fine, silver particles disposed therein;
(3) the photopolymerizable layer; was then exposed through a test target image which is comprised of a

step-wedge and half-tone dot image areas representing the whole spectrum of achievable dot images. The exposure was made to a 4 kw Pulsed Xenon Arc source at 18 inches (45.72 cm) for 5 minutes.

The exposed sample was then processed by dipping the film strip in an etching solution of 42° Baumé ferric chloride for 15 seconds followed by a water rinse. The resulting blue colloidal silver negative image of the original was obtained by etching the colloidal silver layer in an area corresponding to the unexposed photopolymerizable portions. The resulting, high quality, high density image had excellent dot quality.

EXAMPLE 2

A colloidal silver dispersion in gelatin was made as described in Example 1. A photopolymer mixture was made as follows:

| | Ingredients | Amt. (g) |
|---|---|---|
| I. | Aqueous Phase: | |
| | Gelatin | 18.0 |
| | Polyvinylpyrrolidone (40% in water) | 5.0 |
| | Dispersing agent described in Example 1 | 1.0 |
| | Saponin | 3.0 |
| | Fluorinated hydrocarbon (10% in water)$^{(1)}$ | 5.0 |
| | Water | 230.0 |
| | Methylene chloride | 1.0 |
| II. | Organic Phase: | |
| | TMPTA | 20.0 |
| | Plasticizer SC ® described in Example 1 | 3.0 |
| | o-Cl—HABI | 3.0 |
| | 4,4'-bis-dimethylaminobenzophenone (Michler's ketone) | 0.2 |
| | Benzophenone | 1.5 |
| | Methylene chloride | 25.0 |

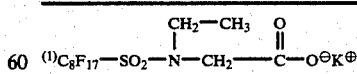

These two phases were then thoroughly mixed in a Waring Blender for about 15 minutes.

The colloidal silver dispersion in gelatin was coated with a 0.006 inch (0.152 mm) doctor knife on a film support as described in Example 1 and the photopolymerizable mixture made above was coated on this dried layer (about 0.7 g/m$^2$ as silver) using a 0.004 inch (0.10 mm) doctor knife. After drying, a sample of this coated film, having a structure similar to that described in Example 1 but with the different photopolymer composition, was exposed five (5) seconds to a Pulsed Xenon Arc (4 kw) at 18 inches (45.72 cm) through a test target (see Example 1). The exposed film was then developed at 68° F. (20° C.) for one minute in a ferricyanide bleach solution which was made as follows:
400 ml ferricyanide soln. (Kodak ® TriMask Bleach)
1600 ml water
300 g. $K_2CO_3$
After development, the image was water rinsed (15 seconds) followed by treatment in conventional silver halide fixer solution (aqueous sodium thiosulfate solution) for 2 minutes at 45° F. 7° C.) to remove haze in the background image. A high quality negative image silver to that described in Example 1 was achieved using this element.

EXAMPLE 3

A colloidal silver emulsion layer was prepared as described in Example 1. A photopolymerizable mixture was then prepared as described in Example 2. A mixture of the two (about 467 g of the colloidal silver emulsion and about 311 g of the photopolymerizable mixture) was prepared by blending thoroughly (Waring Blender) for about 10 minutes. This mixture was then coated on a film support to a coating weight of about 0.7 g/m$^2$ as silver as described in Example 1. Another sample of the photopolymerizable mixture prepared as described in Example 2 was coated contiguous to this layer using a 0.004 inch (0.10 mm) doctor knife and dried. A sample of this dried film was exposed and processed as described in Example 2. The high quality, negative image produced from this process showed less undercutting of the image areas than that of Example 2 because of the presence of photopolymerizable composition in the colloidal silver emulsion layer.

EXAMPLE 4

To demonstrate that the elements of this invention can be used in a positive-working mode, a colloidal silver dispersion was made according to Example 1 and coated on a 0.007 inch (~0.18 mm) polyethylene terephthalate film support to about 0.7 g/m$^2$ of silver as previously described. A photopolymerizable mixture was prepared as described in Example 2 and coated contiguous to the colloidal silver layer using a 0.004 inch (0.10 mm) doctor knife. After drying, a sample of this element was exposed through a positive test target for about 2 minutes at 18 inches (45.72 cm) to the Pulsed Xenon Arc as described in Example 1. The exposed sample was then developed using the following process:
1. Soak 1 minute in a conventional silver halide developer (hydroquinone/metol mixed developers) additionally containing (per liter) 0.2 g thiourea and 1 ml of a solution prepared by dissolving 1 g of phenylmercaptotetrazole in 100 ml ethyl alcohol.
2. Bleach 1 minute in the ferricyanide bleach solution described in Example 2.
3. Water rinse.
4. Fix for 30 seconds in conventional thiosulfate silver halide fixer.
5. Water rinse.
Free sulfide ions provided by the thiourea diffuse imagewise through the exposed diffusion resist of this invention. The sulfide then forms silver sulfide in the unexposed regions and becomes resistant to the bleach. A direct positive image of high quality was obtained.

EXAMPLE 5

To demonstrate an alternative process for preparing a direct positive image using the elements of this invention a sample of the element prepared as follows:

| Ingredients | Amt. (g) |
| --- | --- |
| I. Aqueous Phase: | |
| Gelatin | 18.0 |
| Polyvinylpyrrolidone (40% in water) | 5.0 |
| Dispersing agent described in Example 1 | 1.0 |
| Saponin | 3.0 |
| Fluorinated hydrocarbon described in Example 2 | 5.0 |
| Water | 230.0 |
| Methylene chloride | 1.0 |
| II. Organic Phase: | |
| TMPTA | 20.0 |
| Plasticizer SC ® described in Example 1 | 3.0 |
| α-methyl-1-(2'-nitro-4',5'-dimethoxy)-phenyl-1-(4-t-butylphenoxy)ethane (α-MeBPE) | 0.7 |
| o-Cl—HABI | 5.0 |
| 1,4,4-trimethyl-2,3-diazabicyclo[3.2.2]-non-2-ene-N,N'—dioxide (TAOBN) | 0.05 |
| Methylene chloride | 25.0 |

These phases were blended together for about 10 minutes and then coated with a 0.002 inch (0.05 mm) doctor knife on a film support containing a colloidal silver layer (see Example 4). A sample from the dried coating was given an imagewise exposure (ca. 45 seconds) through a positive test target using the same light source described in Example 4. The target was then removed and the film was given an overall exposure through a Cyasorb ® UV 24 Filter (filters out light above 400 nm) for about 4 minutes using the same light source described above. The first exposure generates inhibitor imagewise while the second exposure causes the monomer to polymerize where no inhibitor has been generated (e.g. unexposed areas). The exposed film was then developed by bleaching as described in Example 2. A high quality, positive image was obtained.

EXAMPLE 6

To demonstrate the use of a different metal particulate, the following dispersion was made:

| Ingredients | Amt. (g) |
| --- | --- |
| Polyvinyl alcohol soln. (10% in water) | 77.0 |
| Copper powder (U.S. Bronze C112) | 35.0 |
| Anionic polyelectrolyte Stockhauser dispersant, Polystabil V6596 (VZ) distributed by Mobay Chemicals, Pittsburgh, PA | 0.5 |
| Distilled water | 23 ml |

This mixture was ball-milled for about 48 hours. It was then coated on a support (see Example 1) using a 0.004 inch (0.10 mm) doctor knife and allowed to dry.
The photopolymerizable composition of Example 2 was coated contiguous to this layer and allowed to dry. A sample of this film was then exposed through a positive test target for about 30 seconds using the exposure device of Example 1. The exposed element was then developed by bleaching for 30 seconds in a 42° Baumé ferric chloride etchant followed by a water rinse. A negative image of good quality was obtained.

I claim:

1. A process for preparing a negative lithographic film which comprises:
   (a) exposing imagewise a photopolymerizable element comprising, in order, (1) a support, (2) a hydrophilic resin layer having dispersed therein fine metal particles, and (3) a photopolymerizable layer comprising a hydrophilic macromolecular organic polymer dispersion medium, including a dispersed phase containing (a) at least one ethylenically unsaturated monomer having a boiling point above 100° C. at normal atmospheric pressure and being capable of forming a high polymer by free-radical initiated, chain-propagating addition polymerization; and (b) in reactive association with the monomer, at least one free radical photoinitiator or photoinitiator system activatable by actinic radiation in an amount constituting from 0.01 to 20.0 percent by weight of the total solids in the dispersion;
   (b) treating the photopolymerized element with a bleach solution which diffuses through the unexposed areas and dissolves the metal particles;
   (c) rinsing the treated element to remove excess bleach;
   (d) drying the element.

2. A process according to claim 1 wherein the hydrophilic resin in layer (2) is gelatin.

3. A process according to claim 1 wherein the hydrophilic resin in layer (2) is polyvinyl alcohol.

4. A process according to claim 1 wherein the metal particles are silver.

5. A process according to claim 1 wherein the metal particles are copper.

6. A process according to claim 1 wherein the bleach solution is a ferricyanide bleach solution.

7. A process according to claim 1 wherein the element is fixed in an aqueous thiosulfate solution.

8. A process according to claim 1 wherein the hydrophilic resin layer (2) contains 5 to 40 percent by weight of a dispersion of (a) ethylenically unsaturated monomer having a boiling point above 100° C. at normal atmospheric pressure and (b) free radical photoinitiator or photoinitiator system.

9. A process according to claim 1 wherein after step (c) the rinsed element is fixed.

10. A process for preparing a positive lithographic film which comprises
    (a) exposing imagewise a photopolymerizable element comprising, in order, (1) a support, (2) a hydrophilic resin layer having dispersed therein fine metal particles, and (3) a photopolymerizable layer comprising a hydrophilic macromolecular organic polymer dispersion medium, including a dispersed phase containing (a) at least one ethylenically unsaturated monomer having a boiling point above 100° C. at normal atmospheric pressure and being capable of forming a high polymer by free-radical initiated, chain-propagating addition polymerization; and (b) in reactive association with the monomer, at least one free radical photoinitiator or photoinitiator system activatable by actinic radiation in an amount constituting from 0.01 to 20.0 percent by weight of the total solids in the dispersion;
    (b) immersing the exposed element in a bath containing a compound capable of generating sulfide ions which diffuse imagewise through the exposed diffusion resist;
    (c) treating the photopolymerized element with a bleach solution which is resisted by the metal sulfide formed in the unexposed areas;
    (d) rinsing the element to remove excess bleach; and
    (e) drying the element.

11. A process according to claim 10 wherein the compound capable of generating sulfide ions is thiourea.

12. A process according to claim 10 wherein the bleach solution is a ferricyanide bleach solution.

13. A process according to claim 10 wherein the hydrophilic resin in layer (2) is gelatin.

14. A process according to claim 10 wherein the metal particles are silver.

15. A process according to claim 8 wherein the monomer is trimethylolpropane triacrylate.

16. A process according to claim 8 wherein the free radical initiator is a 2,4,5-triarylimidazolyl dimer compound.

17. A process according to claim 16 wherein the dimer compound is 2-(o-chlorophenyl)-4,5-diphenylimidazolyl dimer.

18. A process according to claim 10 wherein the hydrophilic resin layer (2) contains 5 to 40 percent by weight of a dispersion of (a) ethylenically unsaturated monomer having a boiling point above 100° C. at normal atmospheric pressure and (b) free radical photoinitiator or photoinitiator system.

19. A process according to claim 10 wherein the monomer is trimethylolpropane triacrylate.

20. A process according to claim 10 wherein the free radical initiator is a 2,4,5-triarylimidazolyl dimer compound.

21. A process according to claim 20 wherein the dimer compound is 2-(o-chlorophenyl)-4,5-diphenylimidazolyl dimer.

* * * * *